(12) United States Patent
Mir et al.

(10) Patent No.: US 8,830,098 B2
(45) Date of Patent: Sep. 9, 2014

(54) SIGMA-DELTA ADC WITH TEST CIRCUITRY

(75) Inventors: Salvador Mir, Saint Hilaire du Touvet (FR); Haralampos Stratigopoulos, Grenoble (FR); Matthieu Dubois, Grenoble (FR)

(73) Assignee: STMicroelectronics International NV, Genève (CH)

( * ) Notice: Subject to any disclaimer, the term of this patent is extended or adjusted under 35 U.S.C. 154(b) by 0 days.

(21) Appl. No.: 13/807,632

(22) PCT Filed: Jun. 28, 2011

(86) PCT No.: PCT/EP2011/060863
§ 371 (c)(1),
(2), (4) Date: Mar. 14, 2013

(87) PCT Pub. No.: WO2012/001019
PCT Pub. Date: Jan. 5, 2012

(65) Prior Publication Data
US 2013/0201046 A1 Aug. 8, 2013

(30) Foreign Application Priority Data
Jun. 30, 2010 (FR) ..................................... 10 02741

(51) Int. Cl.
*H03M 3/00* (2006.01)
(52) U.S. Cl.
CPC .............. *H03M 3/378* (2013.01); *H03M 3/458* (2013.01)
USPC .......................................... 341/143; 341/120

(58) Field of Classification Search
CPC .................. H03M 3/378–3/386; H03M 3/412; H03M 3/424–3/434
USPC .......................................... 341/118–120, 143
See application file for complete search history.

(56) References Cited

U.S. PATENT DOCUMENTS

| | | | | |
|---|---|---|---|---|
| 6,476,752 B1 * | 11/2002 | Eastty et al. | ................... | 341/143 |
| 6,907,374 B1 | 6/2005 | Tsyrganovich | | |
| 7,062,401 B1 | 6/2006 | McGrath | | |
| 7,495,589 B1 * | 2/2009 | Trifonov et al. | .............. | 341/118 |
| 2005/0030209 A1 | 2/2005 | Lee | | |
| 2007/0063885 A1 | 3/2007 | Hong | | |

OTHER PUBLICATIONS

Hao-Chiao Hong et al., A Decorrelating Design-for-Digital-Testability Scheme for Sigma-Delta Modulators, IEEE Transactions on Circuits and Systems—I: Regular Papers, vol. 56, No. 1, Jan. 2009.*
Hao-Chiao Hong, A Design-for-Digital-Testability Circuit Structure for Sigma-Delta Modulators, IEEE Transactions on Very Large Scale Integration (VLSI) Systems, vol. 15, No. 12, Dec. 2007.*

(Continued)

*Primary Examiner* — Howard Williams
(74) *Attorney, Agent, or Firm* — Kaplan Breyer Schwarz & Ottesen, LLP

(57) ABSTRACT

The invention concerns a sigma-delta switched capacitor analog to digital converter (ADC) having: an input line for receiving a signal to be converted; first, second and third inputs for respectively receiving first, second and third test voltages; and switching circuitry adapted to apply, during a test mode of the sigma-delta ADC, a ternary test signal to the input line by periodically selecting, based on a digital test control signal, one of the first, second or third test voltages to be applied to the input line.

18 Claims, 4 Drawing Sheets

(56) References Cited

OTHER PUBLICATIONS

Chee-Kian Ong et al., A New Sigma—Delta Modulator Architecture for Testing Using Digital Stimulus, IEEE Transactions on Circuits and Systems—I: Regular Papers, vol. 51, No. 1, Jan. 2004.*

Luis Rolíndez et al., A 0.18 μm CMOS Implementation of On-chip Analogue Test Signal Generation from Digital Test Patterns, Proceedings Design, Automation and Test in Europe Conference and Exhibition, 2004, IEEE, Feb. 2004.*

Rolindez, L. et al. A Stereo Audio Sigma-Delta ADC Architecture with Embedded SNDR Self-Test, IEEE International Test Conference, 2007, ITC 2007, Oct. 2007. IEEE.*

Written Opinion PCT/EP2011/060863.*

Hak-Soo Yu, et al, "Performance Characterization of Mixed-Signal Circuits Using a Ternary Signal Representation", "Computer Engineering Research Center", Oct. 26, 2004, pp. 1389-1397, Publisher: ISBN: 978-0-7803-8580-1, The University of Texas at Austin, Published in: US.

Anna-Maria Brosa, "International Patent Application No. PCT/EP2011/060863 International Search Report", Jul. 21, 2011, Publisher: PCT, Published in: EP.

* cited by examiner

SIGMA-DELTA ADC WITH TEST CIRCUITRY

FIELD OF THE INVENTION

The present invention relates to a sigma-delta analog to digital converter (ADC), and also to a method of testing a sigma-delta ADC.

BACKGROUND TO THE INVENTION

BIST (built-in self test) circuitry provides a means of testing integrated circuits after manufacture. BIST circuitry is implemented on-chip and thus generally forms part of the final product. It allows test signals to be generated and applied to parts of a circuit under test (CUT), and the results verified automatically on-chip.

Analogue parts of integrated circuits are far more costly to test than the digital parts, due in part to the continuous range of values of the input signals that should be tested. Thus, while analogue parts of integrated circuits usually form only 10-15% of the total area, testing these parts can account for over 50% of the testing cost, which includes the cost of providing test equipment capable of generating the necessary test sequences, and the time required for performing the tests.

ADCs are an example of an analogue component that is often found in the analogue part of integrated circuits, and Sigma-delta ADCs are a popular choice of ADC due to their relatively low quantization noise and low cost in terms of chip area. However, testing a sigma-delta ADC involves applying a high resolution test signal, the values of which should generally be 2 to 3 bits larger than the resolution of the converter, such that any distortion measured at the output originates only from the CUT. Therefore, a sophisticated waveform generator is usually required. Furthermore, advances in sigma-delta ADCs has enabled them to have increased dynamic ranges, and thus the test signal should be capable of testing over these higher ranges. There is a problem in providing a solution that can be implemented as a BIST and that meets these requirements.

SUMMARY OF THE INVENTION

It is an aim of the present invention to at least partially address one or more difficulties in the prior art.

According to one aspect of the invention, there is provided a sigma-delta switched capacitor analog to digital converter comprising: an input line for receiving a signal to be converted; and switching circuitry adapted to apply, during a test mode of said sigma-delta ADC, a ternary test signal to said input line by periodically selecting, based on a digital test control signal, one of first, second or third test voltages to be applied to said input line.

According to one embodiment, said sigma-delta ADC further comprises first, second and third inputs for respectively receiving said first, second and third test voltages.

According to another embodiment, said sigma-delta ADC is a differential converter, said first, second and third test voltages are differential voltages, and each of said first, second and third inputs comprises a pair of differential input terminals across which said first, second and third differential test voltages are applied respectively.

According to another embodiment, the sigma-delta ADC further comprises a fourth input for receiving an analog input signal, wherein said switching circuitry is arranged to apply said analog input signal to said input line during a normal mode of said sigma-delta ADC.

According to another embodiment, the sigma-delta ADC further comprises a first switch coupled between said first input and said input line, a second switch coupled between said second input and said input line, and a third switch coupled between said third input and said input line, wherein said digital test control signal comprises first, second and third control signals adapted to control said first, second and third switches respectively.

According to another embodiment, said first test voltage corresponds to a voltage difference between a first voltage level and a second voltage level applied to differential inputs of said first switch, and said third test voltage corresponds to a voltage difference between said second voltage level and said first voltage level applied to differential inputs of said second switch.

According to another embodiment, said first voltage level is equal to a positive reference voltage applied to a first feedback block of said sigma-delta ADC, and said second voltage level is equal to a negative reference voltage applied to a second feedback block of said sigma-delta ADC.

According to another embodiment, said second test voltage is a differential zero voltage applied to both terminals of a pair of sampling capacitors of said sigma-delta ADC.

According to a further aspect of the present invention, there is provided an integrated circuit comprising the above sigma-delta ADC, and control circuitry adapted to generate said digital test control signal.

According to one embodiment, said control circuitry comprises a sigma-delta modulator for applying sigma-delta modulation to an analog test signal, said sigma-delta modulator comprising two comparators for detecting when the value of said modulated signal is in one of three ranges.

According to another embodiment, said control circuitry is adapted to generate said digital test control signal based on a binary test signal.

According to another embodiment, said control circuitry comprises a delay element adapted to generate a delayed version of the binary test signal, and logic for generating said digital test control signal based on the binary test signal and the delayed version of the binary test signal.

According to another embodiment, said delay element is a linear feedback shift register arranged to store the binary sequence of said binary test signal.

According to another embodiment, the integrated circuit further comprises a memory storing said binary test signal.

According to a further aspect of the present invention, there is provided a method of testing a sigma-delta switched capacitor analog to digital converter comprising applying, during a test mode, a ternary test signal to an input line of said sigma delta ADC. For example, the ternary test signal consists of three different voltage levels. Furthermore, a digital test control signal is for example used to control the injection of said three voltage levels to said sigma delta ADC such that they are applied one at a time to said input line.

According to one embodiment, said sigma-delta ADC is a differential converter and said ternary test signal comprises first, second and third differential voltage levels.

According to another embodiment, said second differential voltage level is a differential zero voltage.

According to another embodiment, said binary test signal is generated based on one of: a binary test signal; and an analog test signal.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION OF EMBODIMENTS OF THE PRESENT INVENTION

In the following, only features and aspects that are useful to an understanding of the invention will be discussed in detail. For example, the generation of an analog test signal for a sigma-delta ADC, and of a binary test signal based on an analog test signal, will be within the capabilities of those skilled in the art and will not be described in detail.

Figure 1:
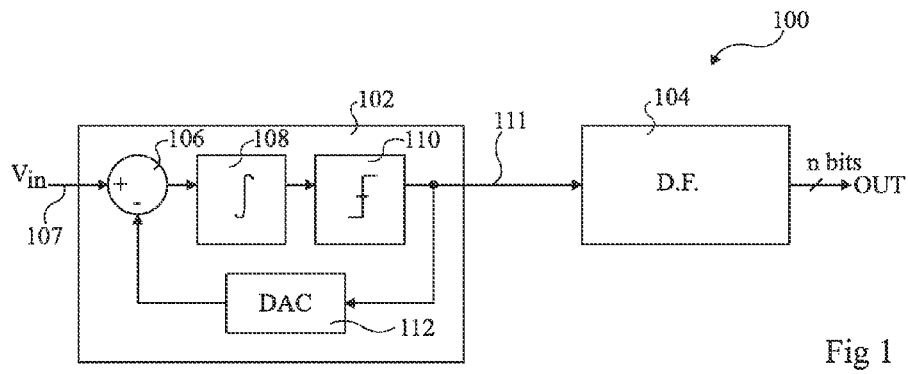
FIG. 1 schematically illustrates an example of a sigma-delta ADC.

FIG. 1 illustrates an example of a sigma-delta ADC 100 comprising a sigma-delta modulator 102 and a decimation filter 104. The modulator 102 comprises a subtractor 106, which subtracts a feedback signal from the input signal voltage $V_{in}$ provided on an input line 107. The output of the subtractor 106 is coupled to an integrator 108, which integrates this signal and provides the result to a 1-bit quantization unit 110. The quantization unit 110 uses a single threshold value to provide a binary output, which is the sigma-delta modulated signal. This signal is provided on an output line 111, coupled to a digital to analog converter (DAC) 112. DAC 112 generates an analog level based on the sigma-delta modulated signal, and provides this analog level on the feedback line to the subtractor 106.

Thus, in operation, the sigma-delta modulator 102 provides a stream of bits having a spectral power determined by the level of the input signal $V_{in}$, wherein the higher the input signal, the higher the power and quantization noise.

The output of the quantization unit 110 on line 111 is provided to the decimation filter 104, which filters the noise and down converts the high frequency bit stream into a high resolution digital code at the Nyquist rate. In particular, this involves applying an averaging filter function and a rate reduction function simultaneously to generate the high resolution digital code.

Figure 2:
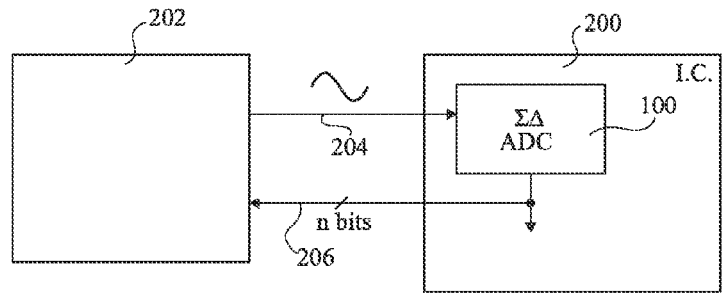
FIG. 2 schematically illustrates an example of test circuitry for testing a sigma-delta ADC.

FIG. 2 shows an example of an integrated circuit 200 comprising the sigma-delta ADC 100 of FIG. 1, and external test equipment 202 for testing the ADC 100. As illustrated, the test equipment provides a high resolution analog test waveform on an input line 204 to the ADC 100, and receives the n-bit output on a line 206 from the ADC.

The arrangement of FIG. 2 is not a BIST solution, and has the drawback that the test equipment is necessarily complex in order to generate the high resolution analog waveform. Furthermore, for cost reasons, the number of test equipment 202 will generally be limited, and downloading to the test equipment the large number of n-bit digital values from the output of the converter 100 takes a relatively long time. Thus testing a large number of integrated circuits using this arrangement will be very time consuming.

Figure 3:
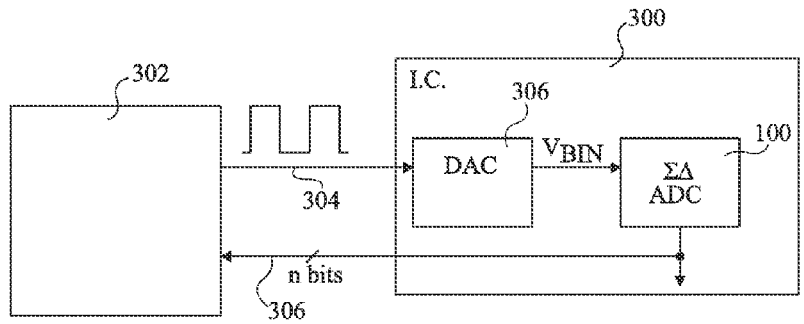
FIG. 3 schematically illustrates an alternative example of test circuitry for testing a sigma-delta ADC.

FIG. 3 illustrates an alternative arrangement that has been proposed, in which an integrated circuit 300 comprises the sigma-delta ADC 100, and receives a binary test signal $V_{BIN}$. The test equipment 302 generates a digital 1-bit signal on an input line 304 to the integrated circuit 300. The input line 304 is coupled to a DAC 306, which converts the digital signal into the binary test signal $V_{BIN}$ by substituting the logic high and logic low levels of the digital signal with desired voltage amplitudes. The use of a purely digital test signal does not necessitate an analog filter at the input of the sigma-delta ADC since the converter architecture rejects the high frequency noise contained in the bit stream.

The arrangement of FIG. 3 could be adapted to become a BIST solution if the digital test signal on line 304 is stored or generated on-chip, and the n-bit output of the sigma-delta ADC 100 analysed on-chip.

However, the use of a binary test signal has the drawback of introducing high quantization noise. As a result, it is necessary to attenuate the amplitude of the binary test signal prior to applying it to the sigma-delta converter, meaning that this technique is not able to test the full dynamic range of the converter.

Figure 4A:
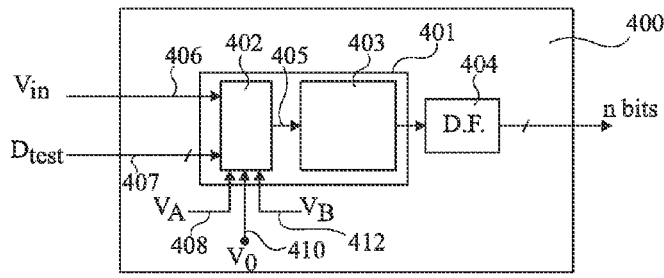
FIG. 4A schematically illustrates an integrated circuit comprising a sigma-delta ADC and test circuitry according to an embodiment of the present invention.

FIG. 4A illustrates a sigma-delta ADC 400 comprising a sigma-delta modulator 401 having input circuitry 402 and a modulation block 403. ADC 400 also comprises a decimation filter 404. Rather than an analogue or binary test signal, a ternary test signal is applied to the converter during a test mode. In particular, the input circuitry 402 provides to the rest of the modulation block 403, on a line 405, an analog input voltage $V_{in}$ during a normal mode of operation, or a ternary test signal during a test mode of operation. The input circuitry receives the analog input voltage $V_{in}$ on an input 406, and a digital test control signal $D_{test}$ at an input 407. The digital test control signal $D_{test}$ is used to generate the ternary test signal by controlling the selection between three test voltages to be applied to the input line 405. In this example, the three test voltages are voltage levels $V_A$, $V_0$, and $V_B$, provided on lines 408, 410 and 412 to the input circuitry. Voltage levels $V_A$ and $V_B$ are for example positive and negative test voltage levels, and $V_0$ is a neutral voltage.

The test voltage levels $V_A$ and $V_B$ may for example have equal absolute magnitudes in the case of a differential implementation, as will be described in more detail below with reference to FIG. 5. The magnitude of test voltages $V_A$ and $V_B$ are for example chosen based on the desired amplitude of the test signal.

The digital test control signal $D_{test}$ encodes, for example on two or three bit lines, the information indicating which of the three test voltage levels, $V_A$, $V_0$ and $V_B$, the ternary test signal is to have at any time.

Figure 4B:
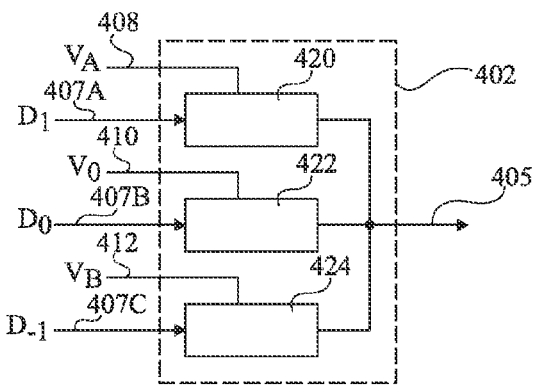
FIG. 4B schematically illustrates input circuitry of the integrated circuit of FIG. 4A in more detail according to an embodiment of the present invention.

FIG. 4B illustrates the input circuitry 402 of the sigma-delta modulator 401 of FIG. 4A in more detail according to one embodiment.

As illustrated, the input circuitry 402 for example comprises switching blocks 420, 422 and 424. Switching block 420 receives a binary signal $D_1$, while switching block 422 receives a binary signal $D_0$ and switching block 424 receives a binary signal $D_{-1}$. Together, the binary signals $D_1$, $D_0$ and $D_{-1}$ form the digital test data signal $D_{test}$ of FIG. 4A. The outputs of switches 420, 422, 424 are all coupled to line 405. Only one of the binary signals $D_1$, $D_0$ and $D_{-1}$ is asserted at any one time, indicating which of the three test voltage levels $V_A$, $V_0$ and $V_B$ should be applied at that time to line 405. Thus each of the switching blocks couples the corresponding voltage level $V_A$, $V_0$, $V_B$ to line 405 when the corresponding binary signal $D_1$, $D_0$, $D_{-1}$ is asserted, for example by a logic "1".

Figure 5:
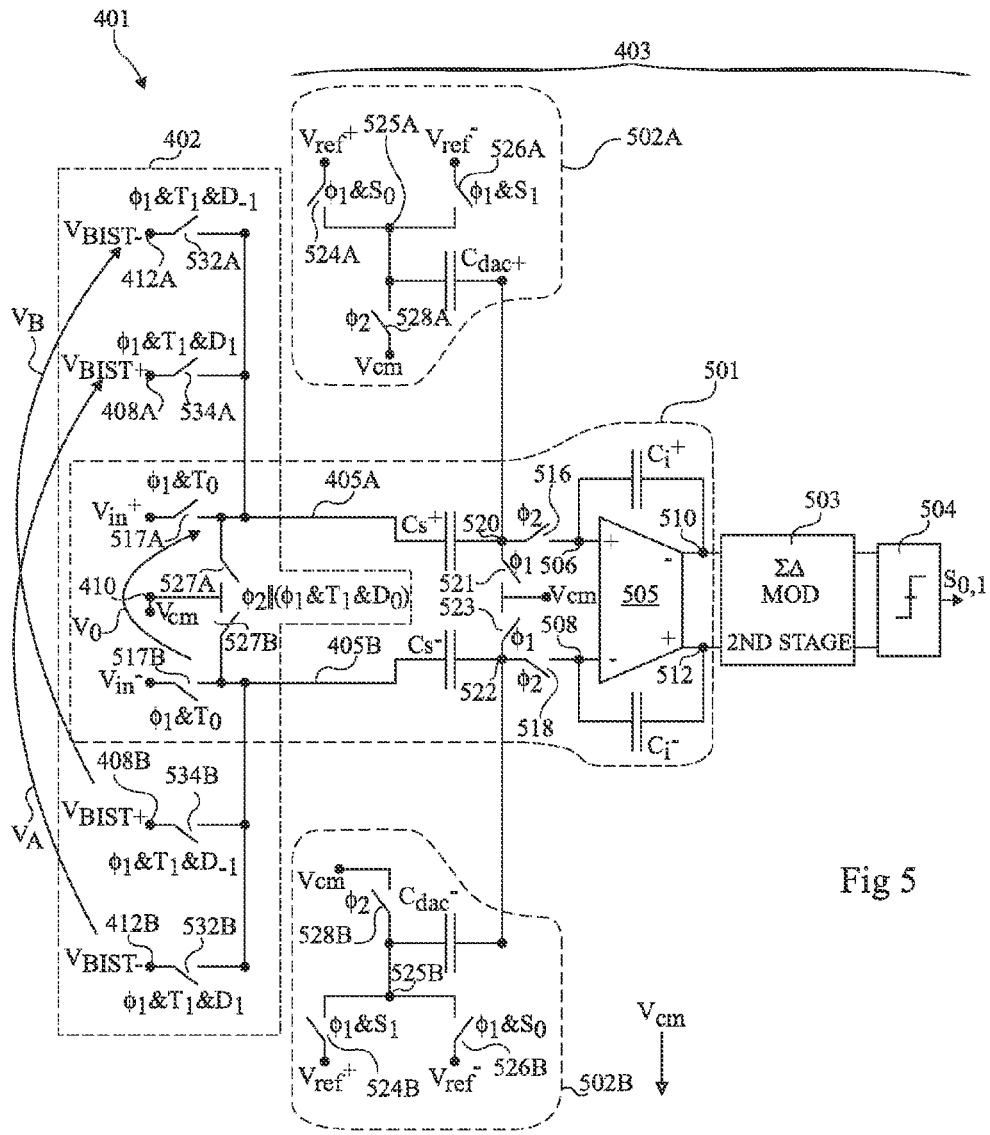
FIG. 5 illustrates a sigma-delta ADC modulator of FIG. 4A in more detail according to an embodiment of the present invention.

FIG. 5 illustrates the modulator 401 of FIG. 4A in more detail according to one embodiment in which the converter is a second-order switched capacitor differential converter. The sigma-delta modulator 401 comprises, in addition to the input circuitry 402, an integrator 501, a feedback stage comprising digital to analog converters 502A and 502B, a sigma-delta modulator second stage 503, and a quantization unit 504.

The integrator 501 comprises an operational amplifier 505 having differential inputs 506, 508 and differential outputs 510, 512, the output 510 being coupled to the input 506 via a capacitor $C_i^+$, and the output 512 being coupled to the input 508 via a capacitor $C_i^-$. The input 506 is coupled via a switch 516 and a sampling capacitor $C_s^+$ to a line 405A, which is in turn coupled to the positive input of the integrator 501 via a switch 517A. The input 508 is coupled via a switch 518 and a sampling capacitor $C_s^-$ to a line 405B, which is in turn coupled to the negative input of the integrator 501 via a switch 517B. A node 520 between switch 516 and capacitor $C_s^+$ is coupled to a common mode voltage $V_{cm}$, via a switch 521, and a node 522 between switch 518 and capacitor $C_s^-$ is coupled to voltage $V_{cm}$ via a switch 523. Furthermore, the integrator 501 comprises switches 527A and 527B coupled between the inputs lines 405A, 405B respectively and voltage $V_{cm}$.

DAC 502A of the feedback stage comprises a switch 524A coupled between a high reference voltage $V_{ref}^+$ and a node 525A, and a switch 526A coupled between a low reference voltage $V_{ref}^-$ and the node 525A. Node 525A is also coupled to the node 520 of integrator 501 via a capacitor $C_{dac}^+$, and to voltage $V_{cm}$ via a switch 528A. Similarly, DAC 502B comprises a switch 524B coupled between a high reference voltage $V_{ref}^+$ and a node 525B, and a switch 526B coupled between a low reference voltage $V_{ref}^-$ and node 525B. Node 525B is coupled to node 522 of integrator 501 via a capacitor $C_{dac}^-$, and to voltage $V_{cm}$ via switch 528B.

The input circuitry 402 comprises switches 532A and 532B coupled between a low test voltage $V_{BIST}^-$ and the input lines 405A and 405B respectively, and switches 534A and 534B coupled between a high test voltage $V_{BIST}^+$ and the input lines 405A and 405B respectively. The input circuitry 402 also comprises the switches 517A, 517B, 527A, 527B of the integrator 501, in that these switches are adapted to additionally receive control signals for controlling the test mode, as will be explained in more detail below. In alternative embodiments, the input circuitry 402 could comprise separate switches to the switches 527A, 527B for coupling the lines 405A, 405B to the differential ground voltage.

The differential outputs of the integrator 501 on lines 510 and 512 are coupled to corresponding inputs of the sigma-delta modulator second stage 503. This second stage 503 for example comprises a further integrator and DACs identical to integrator 501 and DACs 502A, 502B. The differential outputs of modulator 503 are coupled to corresponding inputs of the quantization unit 504, which provides the output signal $S_{0,1}$, which is the sigma-delta modulated signal. In this example, the common mode voltage $V_{cm}$ is the differential ground voltage.

Thus in this embodiment, the test voltage level $V_A$ is generated by the voltage difference between $V_{BIST-}$ and $V_{BIST+}$, in other words it is equal to $V_{BIST+}-V_{BIST-}$. The test voltage $V_B$ is generated by the voltage difference between VBIST+ and $V_{BIST-}$, in other words it is equal to $V_{BIST-}-V_{BIST+}$. By generating the test voltages in this way, it can be ensured that their swing with respect to the different ground voltage are equal. Furthermore, to generate the same differential zero voltage by applying the same common-mode voltage $V_{cm}$ which is also applied to nodes 520 and 522 of the integrator, a neutral voltage can be assured. In some embodiments, the voltages $V_{BIST+}$ and $V_{BIST-}$ are the reference voltages $V_{REF+}$ and $V_{REF-}$ of the DAC respectively. It will be apparent to those skilled in the art that in alternative embodiments, the three test voltage levels $V_A$, $V_0$ and $V_B$ could be generated based on only a single voltage level $V_{BIST}$, and a common mode voltage $V_{cm}$.

The digital control signals to the various switches in FIG. 5 comprise the following signals:

$\Phi_1$, $\Phi_2$: non-overlapping clock signals wherein $\Phi_1$ is true only during a sampling phase and $\Phi_2$ is true only during an integration phase;

$S_0$, $S_1$: complementary versions of the output signal $S_{0,1}$, wherein $S_0$ is true when the output $S_{0,1}$ is low, and $S_1$ is true when the output signal $S_{0,1}$ is high;

$T_1$, $T_0$: complementary versions of a digital test phase signal T, wherein $T_1$ is high only during a test phase and $T_0$ is high only during the normal phase;

$D_{-1}$, $D_0$, $D_1$: form a digital test control signal in which only one of these signals is high at any time, the signal $D_1$ being high when the test voltage is $V_A$, the signal $D_0$ being high when the test voltage is at the differential zero voltage $V_0$ and the signal $D_{-1}$ being high when the test voltage is $V_B$.

The switches 516 and 518 of the integrator 501 are controlled by signal $\Phi_2$, while switches 521 and 523 are controlled by the signal $\Phi_1$. The switches 528A, 528B of the DACs 502A and 502B are controlled by the signal $\Phi_2$, while the switches 524A and 526A are conducting when both $\Phi_1$ and $S_0$ are high, and switches 526A and 524B are conducting when both $\Phi_1$ and $S_1$ are high.

The switches 517A and 517B of the integrator 501 are each conducting when the signals $\Phi_1$ and $T_0$ are high. The switches 532A and 534B of the input circuitry 402 are conducting when signals $\Phi_1$, $T_1$, and $D_{-1}$ are all high. The switches 534A and 532B of the input circuitry 402 are conducting when signals $\Phi_1$, $T_1$, and $D_1$ are all high. The switches 536A and 536B of the integrator 501 are conducting when signal $\Phi_2$ is high, or when signals $\Phi_1$, $T_1$ and $D_0$ are all high.

Thus during a normal mode of operation, the signal $T_0$ is high. When in the normal mode, during a sampling phase when $\Phi_1$ is high, the input voltages $V_{in}^+$, $V_{in}^-$ are sampled to capacitors $C_s^+$, $C_s^-$, and at the same time, inverted feedback voltages are sampled by the DACs 502A, 502B onto the capacitors $C_{dac}^+$ and $C_{dac}^-$ respectively. During the integration phase when $\Phi_2$ is high, the input lines 405A, 405B are grounded to the same common mode voltage $V_{cm}$, and the inverted feedback voltages on capacitors $C_{dac}^+$ and $C_{dac}^-$ are added to the sampled voltage on capacitors $C_s^+$, $C_s^-$ at the inputs 506, 508 of the operational amplifier 504. In this way, the feedback voltages are effectively subtracted from the input voltages before integration.

During the test mode of operation when $T_1$ is high, the DACs 502A, 502B operate as in the normal mode, but the input circuitry 402 of the modulator 401 applies a ternary test voltage. In particular, the switches 527A and 527B are no longer just used for coupling the input lines 405A, 405B to ground during the integration phase, but also provide the differential zero test voltage $V_0$ during the sampling phase by coupling both lines 405A and 405B to the same voltage, in this case the common mode voltage $V_{cm}$. The test voltages $V_A$ and $V_B$ are provided by the additional four switches 532A, 532B, 534A, 534B.

In alternative embodiments, in order to apply the neutral voltage $V_0$, the input lines 405A, 405B could simply be coupled to the inputs $V_{in-}$ and $V_{in+}$, which could be short-circuited. In this case, only switches 517A, 517B will be activated when the voltage $V_0$ is to be applied.

Additionally, in an alternative embodiment, rather than being coupled to the input lines 405A, 405B, the switches 532A,B and 534A,B could be coupled to the $V_{in+}$ and $V_{in-}$ input nodes before the switches 517A and 517B, in other words to the input line 406 of FIG. 4A. This would involve only a simple modification of the timing signals to switches 517A and 517B, as will be apparent to those skilled in the art.

Figure 6:
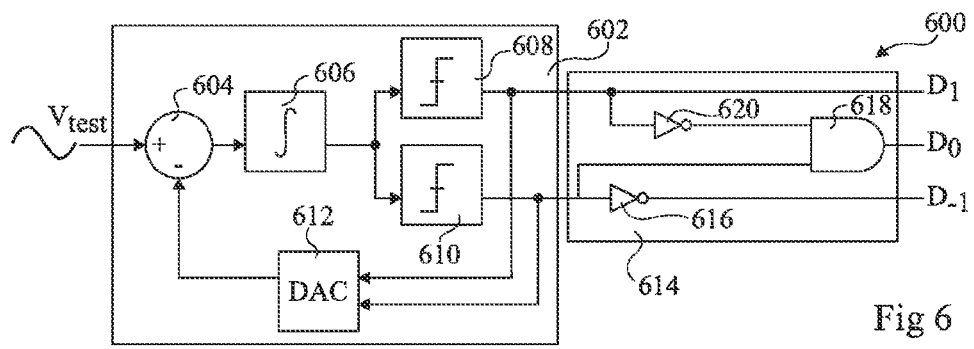
FIG. 6 illustrates circuitry for generating a digital test control signal based on an analogue test signal according to embodiments of the present invention.

FIG. 6 illustrates an example of circuitry 600 for generating, based on an analog test signal $V_{test}$, the digital test control signal $D_{test}$, in this example comprising the three control signals $D_1$, $D_0$ and $D_{-1}$ used in the embodiment of FIG. 5. The circuitry 600 is for example implemented by an appropriate computer-aided tool separate to the chip containing the sigma-delta ADC to be tested, and the sequences of the signals $D_1$, $D_0$ and $D_{-1}$ may for example be stored in a memory embedded on-chip with the sigma-delta modulator to be tested, or stored to a memory of the test equipment such that it can be sent directly to the sigma-delta modulator to be tested via a low-cost test equipment during a testing phase.

The circuitry 600 comprises a multi-bit sigma-delta modulator 602, for example provided by an ideal computer-aided simulation, comprising a subtractor 604, which subtracts a feedback voltage from the input voltage, and provides the result to an integrator 606. The integrator 606 provides the result to a pair of quantization units 608, 610, each having a different quantization level. The outputs of the quantization units 608, 610 are provided to a three-state DAC 612, which provides the feedback voltage to subtractor 604 based on these outputs.

Thus, assuming that quantization unit 608 has a higher threshold than unit 610, the unit 608 is used to determine the cut-off between when the differential zero test voltage $V_0$ and test voltage $V_A$ of the ternary test signal is applied, and the unit 610 is used to determine the cut-off between when the differential zero test voltage $V_0$ and test voltage $V_B$ of the ternary test signal are applied.

A logic block 614 receives the outputs from the quantization units 608, 610, and generates the three control signals $D_1$, $D_0$ and $D_{-1}$ based on these outputs. In particular, the signal $D_1$ is equal to the output of quantization unit 608, $D_{-1}$ is equal to the inverse of the output of quantization unit 608 provided by an inverter 616, and $D_0$ is equal to the AND function, provided by an AND gate 618, between the inverse of the output of quantization unit 608 provided by an inverter 620, and the output of quantization unit 610.

As an alternative, the circuitry 600 could be use to generate a binary test signal, provided to the on-chip circuitry of FIG. 7A or 7B, which will now be described.

Figure 7A:
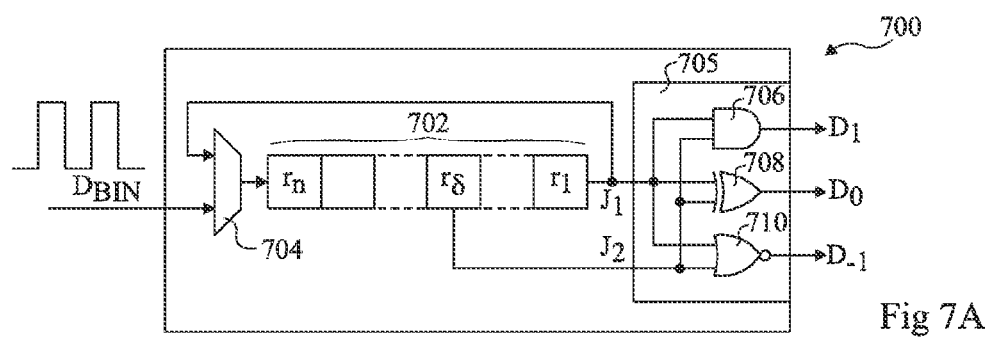
FIGS. 7A and 7B each illustrate circuitry for generating a digital test control signal based on a binary test sequence according to alternative embodiments of the present invention.
Figure 7B:
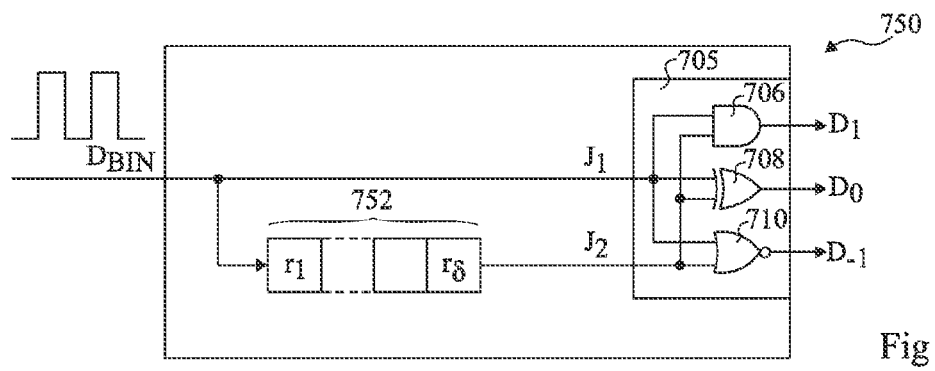

FIGS. 7A and 7B illustrate alternative examples of circuitry for generating the digital test control signals $D_1$, $D_0$ and $D_{-1}$, in this example based on a binary test signal $D_{BIN}$, which is for example stored in a memory on the chip containing the sigma-delta ADC to be tested, or supplied by a low-cost test equipment during a test phase. In this example, the digital test control signal is generated by adding the values of the binary test signal $D_{BIN}$ to a delayed version of the binary test signal.

The generation of a binary test signal is known in the art, and is for example discussed in the paper titled "On-chip Analog Signal Generation for Mixed-Signal Built-In Self-Test", B. Dufort et al. It could be stored in a memory on-chip, or generated by an on-chip digital resonator.

As illustrated in FIG. 7A, a register 702 is comprised of flip-flops $r_1$ to $r_n$, where n is equal to the number N of values in the binary test sequence. The values are initially loaded to the register 702 via a multiplexer 704, which is initially controlled to select the binary test signal $D_{BIN}$. The binary sequence of the binary test signal $D_{BIN}$ for example has a length of N samples at the frequency $F_{clk}$. The frequency Fclk is for example the same frequency as the clocking frequency of the sigma-delta ADC under test, or at a different frequency. Once the N values of the binary sequence have been loaded into the flip-flops $r_1$ to $r_n$, the multiplexer 704 is controlled to select a feedback from the output of the register 702, such that register 702 becomes a linear feedback shift register (LFSR) that circulates the binary test sequence.

The digital test control signals $D_1$, $D_{-1}$ and $D_0$ are generated by a logic block 705 based on the data value $J_1$ in flip-flop $r_1$ at the output of the register, and on the data value $J_2$ in a flip-flop $r\delta$, which is one or more flip-flops before flip-flop $r_1$. The value of $\delta$ is for example equal or greater than 1. Logic block 705 comprises an AND gate 706, which generates signal $D_1$ by performing the AND function on signals $J_1$ and $J_2$, an XOR gate 708, which generates the signal $D_0$ by performing the XOR function on signals $J_1$ and $J_2$, and a NOR gate 710, which generates the signal $D_{-1}$ by performing a NOR function on the signals $J_1$ and $J_2$. Thus, signal $D_1$ is high when $J_1$ and $J_2$ are both high, signal $D_{-1}$ is high when $J_1$ and $J_2$ are both low, and signal $D_0$ is high if only one or the other of the signals $J_1$, $J_2$ is high.

FIG. 7B illustrates an alternative embodiment 752 in which the binary test signal $D_{BIN}$ directly provides the signal $J_1$, and the signal $J_2$ is provided by the output of a register 752 having only $\delta$ registers $r_1$ to $r\delta$. The same logic block 705 as in FIG. 7A is for example used to generate the signals $D_1$, $D_0$ and $D_{-1}$ respectively based on $J_1$ and $J_2$.

An advantage of the embodiment of FIG. 7B is that the register 752 is smaller than the register 702 of FIG. 7A, and thus the area overhead is lower. The binary sequence is supplied periodically for example by repeatedly sending it from the memory of an external low-cost test equipment, or by generating it repeatedly by a digital resonator.

The present inventors have shown that the amplitude $A_T$ of the ternary test sequence that can be generated based on the control signals generated by the circuits of FIG. 7A or 7B has the following relation with respect to the amplitude $A_B$ of the $$A_T = A_B \left| \cos \frac{\pi \delta}{N} \right|$$

binary test sequence $V_{BIN}$:
where $\delta$ is the delay in clock cycles of the delayed binary stream, and N is the sequence length.

Furthermore, the phase difference between the phase $\Phi_T$ of the binary test signal and the phase $\Phi_B$ of the ternary test signal is as follows:

$$\Phi_T - \Phi_B = -\frac{\pi}{N}\delta$$

Thus, the amplitude $A_T$ of the ternary signal is reduced according to a cosine function of the delay $\delta$, and the phase difference between the binary and ternary signals varies linearly with $\delta$. These relations allow relatively simple control of the amplitude and phase of the ternary test signal.

As an example, for a value of $\delta$ of 1, the ternary signal can be shown to have almost half the quantization noise power with respect to its binary counter part.

Figure 8:
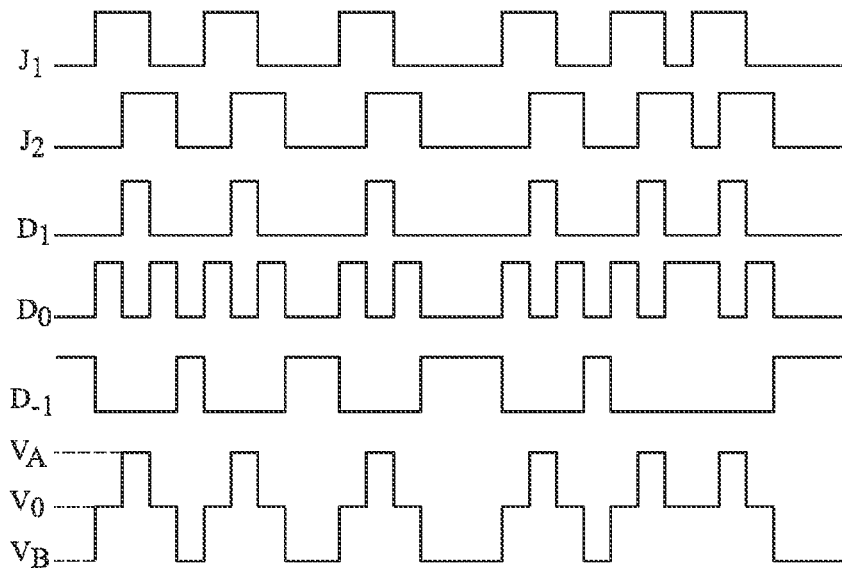
FIG. 8 is a timing diagram showing signals of the circuits of FIGS. 7A and 7B and an example of a resulting ternary test signal.

FIG. 8 illustrates and example of the binary signals $J_1$ and $J_2$ of FIG. 7A or 7B, and the corresponding digital test control signals $D_1$, $D_0$ and $D_{-1}$, and an example of a resulting ternary test signal generated based on these control signals, and having the test voltage levels $V_A$, $V_B$ and $V_0$.

Figure 9:
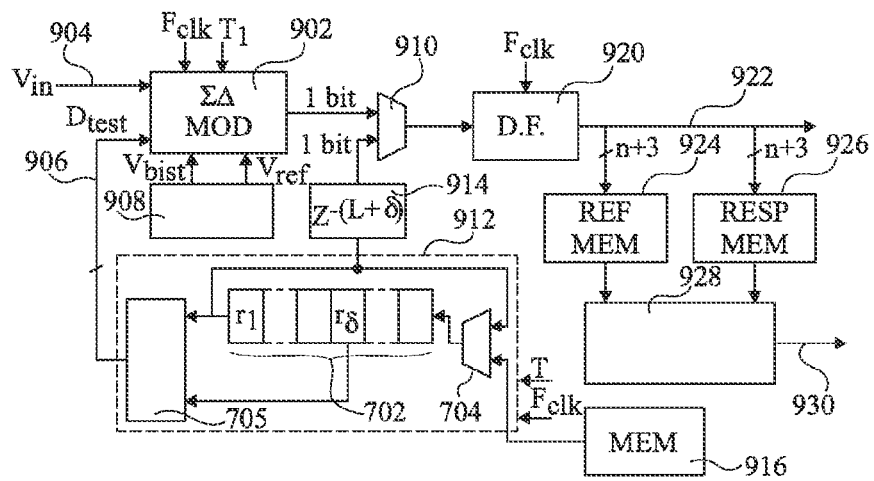
FIG. 9 illustrates a sigma-delta ADC with BIST according to an embodiment of the present invention.

FIG. 9 illustrates an integrated circuit 900 comprising a sigma-delta ADC and BIST. As illustrated, a sigma-delta modulator 902, which for example comprises the modulator 401 with input circuitry 402 of FIG. 5, receives an analog signal on an input line 904, and a digital test control signal $D_{test}$ on an input line 906. The modulator 902 also receives a timing signal $F_{clk}$ used for generating the phase signals $\Phi_1$ and $\Phi_2$ of FIG. 5, and the signal T indicating the activation of the test mode. A block 908 provides the reference voltage $V_{ref}^+$ and $V_{ref}^-$, and the test voltages $V_{BIST+}$ and $V_{BIST-}$ of FIG. 5. The 1-bit output of the modulator 902 is provided to a two-input multiplexer 910, the other input being provided by a control block 912 via a delay block 914. Control block 912 in this example corresponds to the circuitry 700 of FIG. 7A, and comprises the register 702, multiplexer 704, and logic block 705, although in alternative embodiments other circuit arrangements could be used. The multiplexer 704 has an input coupled to an on-chip pin access 916 for loading a binary sequence into the register 702 for example from an external test equipment (not shown). The delay block 914 receives the signal $J_1$ from the output of the register 702.

The output of multiplexer 910 is coupled to a decimation filter 920, which also receives the timing signal $F_{clk}$, and which provides an output on an output line 922 of n+3 bits in parallel for generating a high resolution reference signal.

The output line 922 is coupled to a reference memory 924, which stores a reference sequence, and a response memory 926, which stores a response sequence. The reference and response sequences are compared by a block 928, which provides a result on an output line 930.

In operation, initially, the binary test sequence is loaded into the register 702. It is then provided to the delay block 914, which introduces a delay $Z^{-(L+\delta)}$, where L is the order of the sigma-delta converter, for example equal to 2. Thus, assuming a $\delta$ value of 1, the block 914 introduces a three-cycle delay, such that the code values at the output of decimation filter are synchronised with the corresponding output code values of the sigma-delta modulator 902 under test.

The digital multiplexer 910 is controlled to couple the output of the delay block 914 to the decimation filter 920. The values, after filtering by the decimation filter 920, from the delay element 914 are stored in the reference memory 924. Then, the same binary test sequence loaded into the register 702 is provided to the sigma-delta modulator 902 under test. The digital multiplexer 910 is controlled to couple the output of the ADC 902 to the decimation filter 920, and the values, after filtering by the decimation filter 920, from the converter 902 are stored in the response memory 926.

The analysis block 928 then analyses the sequences in memories 924 and 926 to determine whether the test is successful, for example using a sine wave fitting algorithm. Such a technique is for example discussed in the publication titled "A Stereo Audio ΣΔ ADC Architecture with Embedded SNDR Self-Test", L. Rolindez et al. For example, a SNR (signal-to-noise-ratio) and SNDR (signal-to-noise-and-distortion-ratio) are calculated and compared with acceptable ranges to generate a pass/fail output signal.

The delay parameter $\delta$ is for example selected to have a particular optimized value for each amplitude value of the ternary test signal. In particular, the ternary test signal ideally has a high SNDR (signal-to-noise-and-distortion-ratio) and a low power. By simulation, the SNDR and power for given values of $\delta$ and the amplitude can be determined, and used to select the optimal value of $\delta$.

An advantage of embodiments described herein in which a ternary test signal is applied to test a sigma-delta ADC is that such a signal has a reduced quantization noise and a better resolution of the test when compared to a binary signal. This allows dynamic performance measurements close to the full input dynamic range of the sigma-delta ADC under test. Furthermore, no filter is needed at the input of the sigma-delta ADC to filter the ternary signal as the converter architecture rejects the high frequency noise present in the ternary stream. Also, the ternary test sequence may be generated or stored on-chip, thereby permitting a full BIST solution.

Furthermore, little modification of the sigma-delta ADC under test is needed, as the input circuitry is merely modified to comprise a few additional switches.

Furthermore, advantageously, the digital test control signal $D_{test}$ for the ternary test stream is generated based on a binary test signal in a simple fashion. By generating the ternary test signal based on the addition of the binary test signal to a delayed version of the binary test signal, the amplitude and phase of the ternary test signal can be controlled in a simple manner.

Furthermore, a test signal having three states better emphasizes non-linearity in the integrator stage than a binary test signal, due to the extra state.

While a number of specific embodiments of the invention have been described with reference to the figures, it will be apparent to those skilled in the art that there are numerous modifications and variations that may be applied.

For example, it will be apparent to those skilled in the art that the ternary test signal could be generated based on a binary test signal, or by other means.

Furthermore, it will be apparent to those skilled in the art that the three signals $D_1$, $D_0$ and $D_{-1}$ could be replaced by a 2-bit signal for example having the value "00" when the low test voltage $V_{BIST-}$ is to be selected, the value "01" or "10" when the common mode test voltage $V_{cm}$ is to be selected, or the value "11" when the high test signal $V_{BIST+}$ is to be selected.

While the embodiment of FIG. 5 is a second-order converter, it will be apparent to those skilled in the art that the principles described herein could be applied to any sigma-delta modulator architecture, having any number of stages, any feedback DAC architecture, and producing any number of bits.

It will be apparent to those skilled in the art that the various features described herein in relation to the various embodiments could be combined in any combination in alternative embodiments of the invention.

The invention claimed is:

1. A sigma-delta switched capacitor analog to digital converter (ADC) comprising:
   an input line for receiving a signal to be converted; and
   switching circuitry adapted to apply, during a test mode of said sigma-delta ADC, a ternary test signal to said input line by periodically selecting, based on a digital test control signal, one of first, second or third test voltages to be applied to said input line.

2. The sigma-delta ADC of claim 1, further comprising: first, second and third inputs for respectively receiving said first, second and third test voltages.

3. The sigma-delta ADC of claim 2, wherein said sigma-delta ADC is a differential converter, said first, second and third test voltages are differential voltages, and each of said first, second and third inputs comprises a pair of differential input terminals across which said first, second and third differential test voltages are applied respectively.

4. The sigma-delta ADC of claim 2, further comprising a fourth input for receiving an analog input signal, wherein said switching circuitry is arranged to apply said analog input signal to said input line during a normal mode of said sigma-delta ADC.

5. The sigma-delta ADC of claim 2, further comprising a first switch coupled between said first input and said input line, a second switch coupled between said second input and said input line, and a third switch coupled between said third input and said input line, wherein said digital test control signal comprises first, second and third control signals adapted to control said first, second and third switches respectively.

6. The sigma-delta ADC of claim 5, wherein said first test voltage corresponds to a voltage difference between a first voltage level and a second voltage level applied to differential inputs of said first switch, and said third test voltage corresponds to a voltage difference between said second voltage level and said first voltage level applied to differential inputs of said second switch.

7. The sigma-delta ADC of claim 6, wherein said first voltage level is equal to a positive reference voltage applied to a first feedback block of said sigma-delta ADC, and said second voltage level is equal to a negative reference voltage applied to a second feedback block of said sigma-delta ADC.

8. The sigma-delta ADC of claim 1, wherein said second test voltage is a differential zero voltage applied to both terminals of a pair of sampling capacitors of said sigma-delta ADC.

9. An integrated circuit comprising the sigma-delta ADC of claim 1, and control circuitry adapted to generate said digital test control signal.

10. The integrated circuit of claim 9, wherein said control circuitry comprises a sigma-delta modulator for applying sigma-delta modulation to an analog test signal, said sigma-delta modulator comprising two comparators for detecting when the value of said modulated signal is in one of three ranges.

11. The integrated circuit of claim 9, wherein said control circuitry is adapted to generate said digital test control signal based on a binary test signal.

12. The integrated circuit of claim 11, wherein said control circuitry comprises a delay element adapted to generate a delayed version of the binary test signal, and logic for generating said digital test control signal based on the binary test signal and the delayed version of the binary test signal.

13. The integrated circuit of claim 12, wherein said delay element is a linear feedback shift register arranged to store the binary sequence of said binary test signal.

14. The integrated circuit of claim 11, further comprising a memory storing said binary test signal.

15. A method of testing a sigma-delta switched capacitor analog to digital converter (ADC) comprising applying, during a test mode, a ternary test signal to an input line of said sigma delta ADC.

16. The method of claim 15, wherein said sigma-delta ADC is a differential converter and said ternary test signal comprises first, second and third differential voltage levels.

17. The method of claim 16, wherein said second differential voltage level is a differential zero voltage.

18. The method of claim 15, wherein said binary test signal is generated based on one of
   a binary test signal; and
   an analog test signal.

* * * * *